(12) United States Patent
Stoffel et al.

(10) Patent No.: US 6,289,338 B1
(45) Date of Patent: Sep. 11, 2001

(54) DATABASE ANALYSIS USING A PROBABILISTIC ONTOLOGY

(75) Inventors: Killian Stoffel, Columbier (CH); Robert L. Wood, Rush, NY (US)

(73) Assignee: Manning & Napier Information Services, Rochester, NY (US)

( * ) Notice: Subject to any disclaimer, the term of this patent is extended or adjusted under 35 U.S.C. 154(b) by 0 days.

(21) Appl. No.: 09/452,905

(22) Filed: Dec. 1, 1999

Related U.S. Application Data

(63) Continuation of application No. 09/038,808, filed on Mar. 11, 1998, now Pat. No. 6,094,650, which is a continuation of application No. 08/990,316, filed on Dec. 15, 1997, now abandoned.
(60) Provisional application No. 60/143,846, filed on Jul. 15, 1999.

(51) Int. Cl.$^7$ .................................................. G06F 15/30
(52) U.S. Cl. ............................................................ 707/3
(58) Field of Search ............................... 707/1, 3, 4

(56) References Cited

U.S. PATENT DOCUMENTS 5,724,573 * 3/1998 Agrawal et al. .......................... 707/6
5,802,254 * 9/1998 Satou et al. ............................ 706/58

OTHER PUBLICATIONS

Ranade et al, DB2 Concepts, Programs, and Design, McGraw–Hill, p. 63–94, 1990.*
Nicolaisen, "WizRule may be the key to avoiding database disasters", Computer Shopper vol. 15, No. 11 pp. 588(3), Nov. 1995.*
Ziarko et al. Discovering Attribute Relationships, Dependencies and Rules by Using Rough Sets, Procd of the 28th Hawaii Intnat.Conf. on System Sciences, pp 293–299, 1995.*
Han et al. "Data Driven Discovery of Quantitative Rules in Relational",IEEE trans. on Knowledge and Data Engineering. pp29–40, vol.5 No. 1, Feb. 1993.*

* cited by examiner

*Primary Examiner*—Jack Choules
(74) *Attorney, Agent, or Firm*—Charles J. Kulas; Townsend and Townsend and Crew, LLP

(57) ABSTRACT

A method and system for efficiently analyzing databases. In one embodiment, the invention is used to analyze data represented in the form of attribute-value (a-v) pairs. A primary step in building the ontology is to identify parent, child and related a-v pairs of each given a-v pair in the database. A parent is an a-v pair that is always present whenever a given a-v pair is present. A child is an a-v pair that is never present unless the given a-v pair is present. Related pairs of a given a-v pair are those a-v pairs present some of the time when a given a-v pair is present. The system calculates relationships between a-v pairs to produce tables of a-v pairs presented according to the relationships. The user performs additional analysis by investigating the a-v pair relationships through a graphical user interface. Additional visualizations of the data are possible such as through Venn diagrams and animations. Plain-text data documents collected, for example, from the Internet can be analyzed. In this case, the system pre-processes the text data to build a-v pairs based on sentence syntax.

3 Claims, 9 Drawing Sheets

DATABASE ANALYSIS USING A PROBABILISTIC ONTOLOGY

RELATED APPLICATIONS

This application is a continuation of U.S. patent application Ser. No. 09/038,808, filed Mar. 11, 1998, now U.S. Pat. No. 6,094,650 entitled "Database Analysis Using a Probabilistic Ontology," the disclosure of which is incorporated by reference.

This application claims priority from provisional U.S. patent application Ser. No. 60/143,846 filed Jul. 15, 1999, which is a continuation of U.S. patent application Ser. No. 08/990,316 filed Dec. 15, 1997, now abandoned.

BACKGROUND OF THE INVENTION

This invention relates in general to computer database systems and more specifically to a computer database system using an ontology structure to allow analysis of the database.

The proliferation of computer systems and improvements in telecommunications makes an overwhelming amount of data available to a computer user. Massive networks such as the Internet provide millions upon millions of data items in the form of words, numbers, images, etc., in very diverse and unregulated forts. Other, smaller, databases and database systems, such as intranets and stand-alone computer systems, are more restrictive in their data formats yet still provide large volumes of data to the user. Perhaps the smallest application of a computerized database is with today's so-called personal digital assistance (PDAs) which may contain an individual's address book, calendar, or similar personal database.

Within the range of all of these database systems lie the same basic problems of efficient access to, and analysis of, the data. Typical database applications are designed primarily to provide ease of data entry, upkeep and retrieval. However, the applications require that the database be specifically designed for a target application, e.g., medical record-keeping, so that "records," "templates," or similar structures must be designed by a database programmer or architect in order for the database application to be useful to an end user. For example, the Access database program, manufactured by Microsoft Inc., requires the creation of records having multiple fields. Information of predetermined types is entered into the fields. The information is accessed using the same predetermined fields.

Such a database system provides a query language so that a user can form relational inquires into the database. In a medical records database, for example, a user can retrieve records from the database that include a specific patient's name AND were created AFTER a certain date. The "AND" operator is a relational operator between the two desired attributes of "patient name" and "creation date." The AFTER operator modifies the query range by using the creation date.

More recently, popular database search engines have been created which allow users to search larger, less-structured databases such as the Internet with similar relational query operators. For example, search engines by Yahoo! and AltaVista allow relational queries using keywords that do not relate to specific attributes and fields. Instead, any document having words with a specified relationship, such as the above relationship used in the example, is listed as a possible document of interest to the user. While relational database queries are useful in searching for information, they require that the user know with high specificity the type of information sought.

Another use for databases is to provide a platform for analyzing data to determine characteristics, trends or predictive guidelines in the information. For example, where financial data is being analyzed it may be useful to discover that where inflation is high in an overseas market, bond prices in a different market are also high with a very high frequency. Or, in a medical research application, it would be useful to determine that in a high percentage of cases where a certain treatment was used the recovery time was very short. However, such analysis of data is not possible with traditional database applications which singularly focus on retrieving existing data and entering and maintaining data of predetermined formats using relational queries.

Thus, it is desirable to provide a technique and system for analyzing characteristics of data in the matter discussed above. Further, it is desirable to provide such a technique and system that is usable with databases regardless of the size or level of structuring of the database. Also, given the vast amount of data available, it is vital that the results of the analysis be presented in a form that is efficient for detecting trends, qualities or other useful information among the data being analyzed.

SUMMARY OF THE INVENTION

The present invention provides a method and system for efficiently analyzing databases. In one embodiment, the invention is used to analyze data represented in the form of attribute-value (a-v) pairs. A primary step in building the ontology is to identify parent, child and related a-v pairs of each given a-v pair in the database. A parent is an a-v pair that is always present whenever a given a-v pair is present. A child is an a-v pair that is never present unless the given a-v pair is present. Related pairs of a given a-v pair are those a-v pairs present some of the time when a given a-v pair is present.

The system calculates relationships between a-v pairs to produce tables of a-v pairs presented according to the relationships. The user performs additional analysis by investigating the a-v pair relationships through a graphical user interface. Additional visualizations of the data are possible such as through Venn diagrams and animations. Plain-text data documents collected, for example, from the Internet can be analyzed. In this case, the system preprocesses the text data to build a-v pairs based on sentence syntax.

One embodiment of the invention provides a method for analyzing a database where the database includes a plurality of records having a-v pairs. The method executes on a computer system and includes the following steps: determining two or more parents of a given a-v pair where a parent of an a-v pair is another a-v pair that exists within every record that the given a-v pair exists; and displaying the two or more parents on the display screen along with an indication that two or more parents are associated with a given a-v pair.

DESCRIPTION OF THE PREFERRED EMBODIMENT

Figure 1:
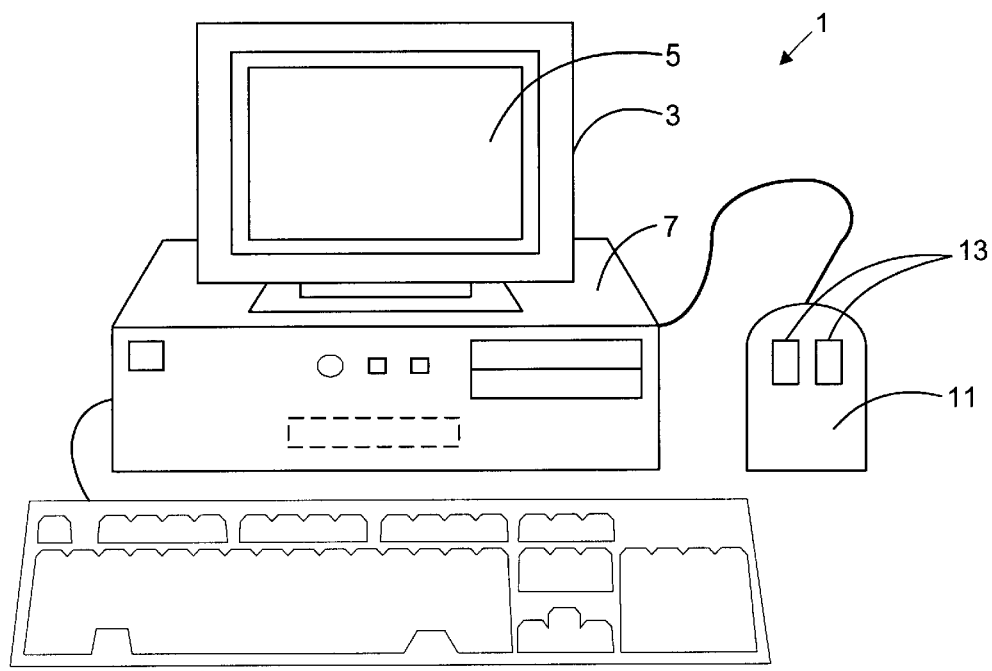
FIG. 1 shows a basic computer system suitable for executing the software of the present invention.

FIG. 1 shows a basic computer system 1 suitable for executing the software of the present invention. Computer system 1 includes a display device 3 with a display screen 5. Cabinet 7 houses additional components of the computer system (not shown) such as a processor, memory, disk drive, compact disc read only memory (CD-ROM), etc. Keyboard 9 and mouse 11 are standard user input devices. Mouse 11 includes buttons 13 for facilitating user input.

Figure 2:
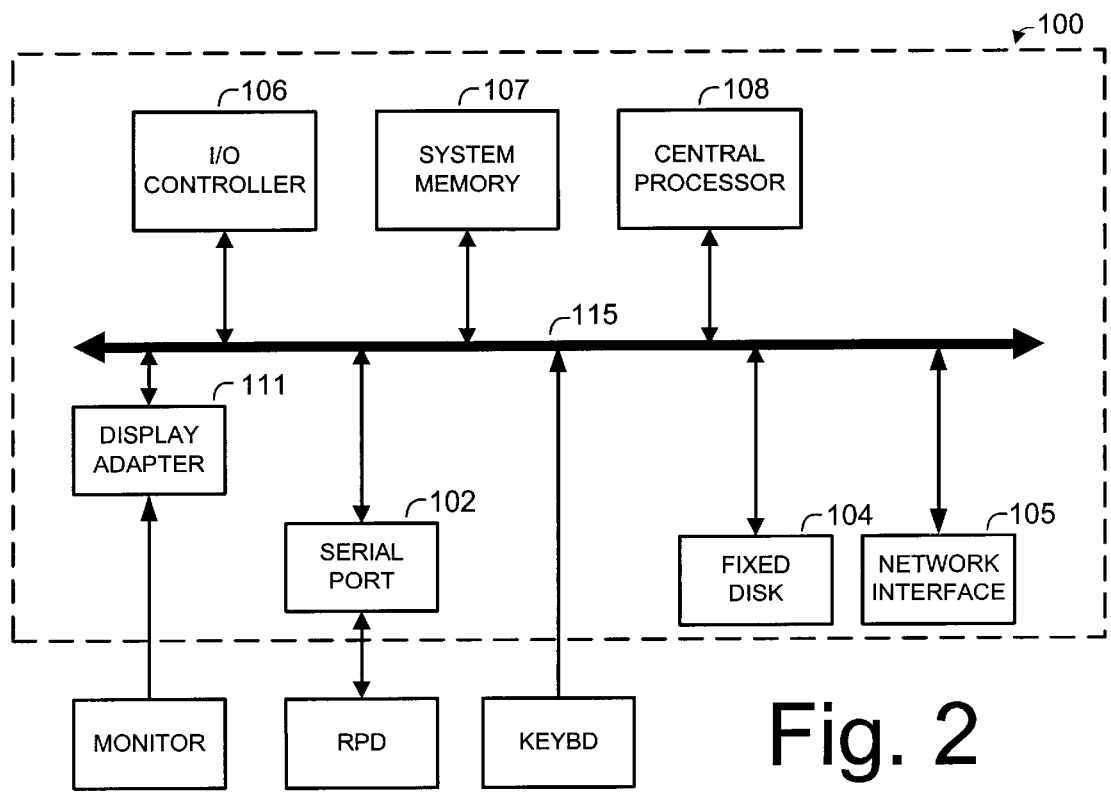
FIG. 2 shows subsystems in the computer system of FIG. 1.

FIG. 2 shows several subsystems interconnected via a bus 115. Central processor 108 communicates with system memory 107, fixed disk 104, I/O controller 106, display adapter 111, serial port 102 and netowork interface 105. some subsystems interface to user input and output devices such as the monitor, remote pointing device (RPD) or, "mouse," and keyboard which are also shown in FIG. 1. Network interface 105 is used to connect the computer system to additional external computer systems on a network. Many other configurations of subsystems are possible. A computer system suitable for use with the present invention can use less subsystems, components or devices than those shown in FIG. 2. For example, a handheld computer may include only a processor, memory (both random-access memory (RAM) and read-only memory (ROM)), small display screen and keyboard. Also, computer systems suitable for use with the present invention may include more subsystems than are shown in FIG. 2. For example, the handheld computer may include a, PCMCIA card interface for storing and retrieving data from an external card.

Figure 3:
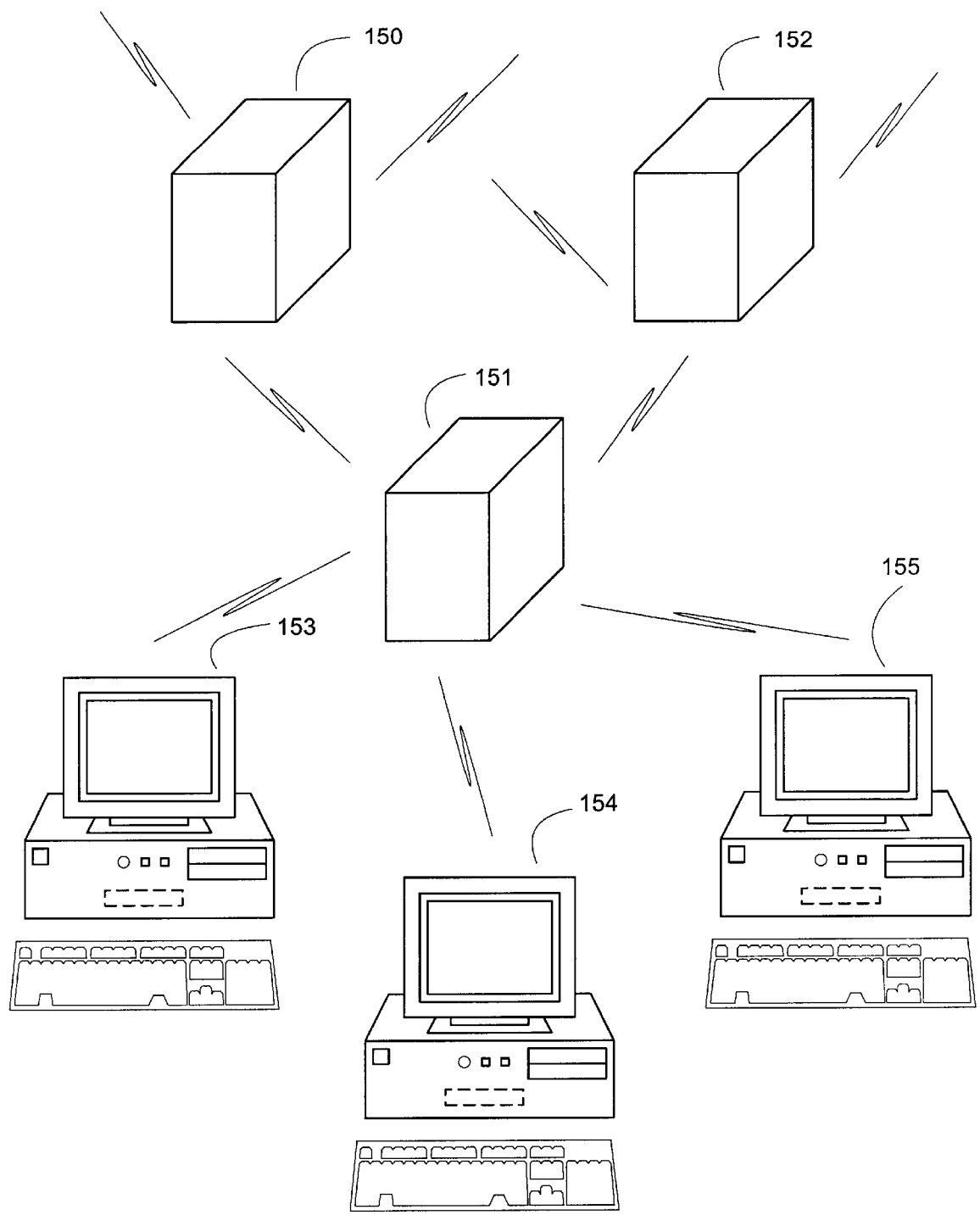
FIG. 3 shows a generalized computer network.

FIG. 3 shows a generalized computer network.

In FIG. 3, servers such as server 150, 151 and 152 may be interconnected by any communication means and in any network topology. For example, the servers can be connected by hardwire, radio frequency transmissions, infrared transmissions, etc. They can be connected in a star, ring, daisy chain, etc., schemes. Also, any communication protocol such as Ethernet, IEEE 1394 or TCP/IP can be employed.

User stations 153, 154 and 155 are shown connected to server 151. Again, the interconnection between the computer stations and the server, or servers, can be by any means, topology and protocol as is known. Although all of the computer stations are shown connected to server 151, additional servers having any number of additional computer stations can be added to the interconnected network of FIG. 3. Although the specific embodiment is discussed with reference to a single computer station, such as computer station 153, accessing a database on a server, such as server 151, it should be readily apparent that the database can be distributed over two or more servers or computers. Further, the database can exist partially, or completely, on the computer stations themselves. That is, computer station 153 can operate as a stand-alone database where the database engine, along with the data, auxiliary programs, etc. all reside within the computer station. The idea of distributed databases is well-known in the art. Many variations on distributing data, and many designs of database "front ends" or user interfaces are possible without deviating from the scope of the present invention.

A preferred embodiment of the invention executes software on a workstation. The workstation can typically contain the database that is being analyzed. Alternatively, the workstation can be connected to a network and the database can be remote. A user operates the software via the user input devices. Output is presented to the user through the display screen or by other methods such as hard copy output from a printer. It should be apparent that, although not directly discussed here, many types of user input and output devices are suitable for use with the present invention. For example, a trackball, digitizing tablet, light pen, data glove,etc. can all be used to provide input to the software.

Figure 4A:
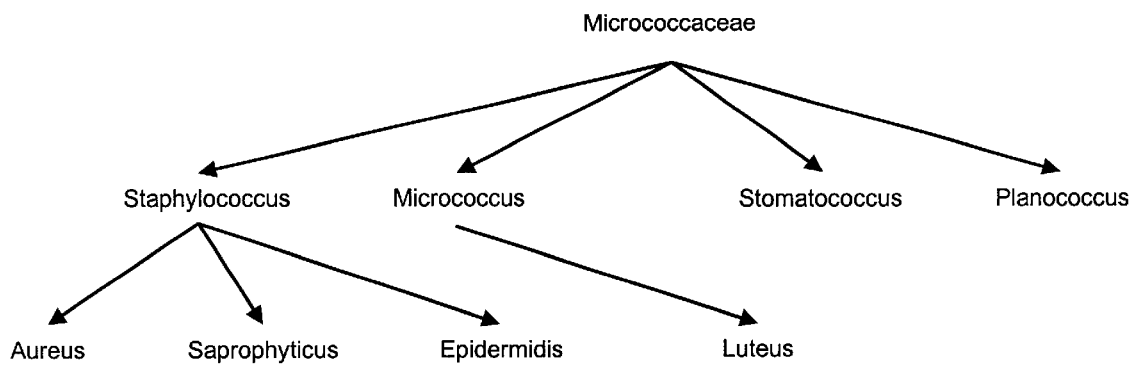
FIG. 4A shows a taxonomy diagram.

FIG. 4A shows a taxonomy diagram for a classification system used in zoology. FIG. 4A is presented and discussed to introduce the concept of an ontology (a generalized taxonomy) and to define some terms.

In FIG. 4A, the top level, or row, of the diagram is the "familiy" while the next two rows down are the "genus" and "species." This information can be represented in a database as "entries" consisting of attribute-value pairs. This database representation is shown in Table I, below.

TABLE I

|   | Family | Genus | Species |
|---|--------|-------|---------|
| 1 | Micrococcaceae | Staphylococcus | *Aureus* |
| 2 | Micrococcaceae | Staphylococcus | *Saprophyticus* |
| 3 | Micrococcaceae | Staphylococcus | *Epidermidis* |
| 4 | Micrococcaceae | Micrococcus | *Luteus* |

In Table I, the columns labelled "Family," "Genus" and "Species" are attributes. Each horizontal row is an entry in the database. Each entry has values for each defined attribute as shown in the corresponding column. Thus, entry 1 has a-v pairs as follows: (Family, Micrococcaceae), (Genus, Staphylococcus) and (Species, *Aureus*). These can be abbreviated as (F, M), (G, S) and (S, A).

A feature of the present invention is the ability to "work backward" to determine classification schemes based on database entries such as those shown in Table I. The system defines "parent" and "child" a-v pairs in relation to other a-v pairs. A first a-v pair is a parent of a second a-v pair if the first a-v pair occurs in every entry that the second a-v pair occurs. Thus, (F, M) is a parent to (G, S), (G, M), (S, A), (S, S), (S, E) and (S, L). A first a-v pair is a child to a second a-v pair if the first a-v pair never occurs in an entry unless the second a-v pair is also in the entry. From Table I, (G, S) is a child of (F, M) and (S, A) is a child to both (G, S) and (F, M).

By starting with a database, such as the database represented in FIG. 4A, an analysis can be performed on the a-v pairs to determine all of the parent and child relationships. By considering parent pairs as classes of those pairs that are their childs, the classification hierarchy shown in FIG. 4A is achieved.

Figure 4B:
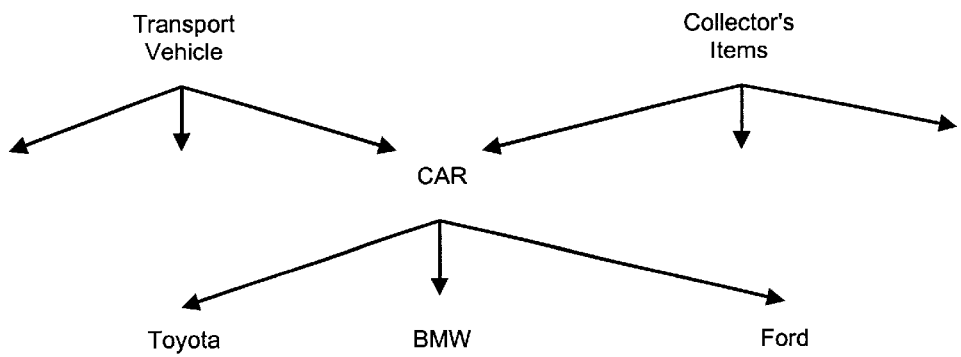
FIG. 4B shows an ontology diagram.

A characteristic of the data shown in FIG. 4A and Table I is that each a-v pair has, at most, one parent a-v pair. It is easy to imagine databases where more than one parent exists for a given a-v pair. Such a database example is shown in FIG. 4B where the item CAR has more than one parent. Note that, in FIG. 4B, the items will be treated as values of attributes. The attributes themselves are not named but can be assigned as "quality" for the top row, "object" for the second row and "manufacturer" for the bottom row. In this case, the a-v pair (object, car) has (quality, transport vehicle) and (quality, collector's items) as its two parent nodes. Such an organization of data where an item can have more than one parent is referred to as an "ontology." A generalization to the ontology organization is to allow probabilistic relationships between the a-v pairs. So far, parent and child a-v pairs are shown as absolute existences. However, in any database, especially large databases, there are likely to be errors in the data. Also, characteristics and trends of interest will likely show up as statistical occurences of something less than 100%. The ontology described so far is not flexible in handling rates of occurence. The present invention solves this problem by creating a probabilistic ontology where statistics on rates of occurence of parent and child relationships are computed and compiled for use in analysis.

A preferred embodiment of the present invention is referred to as the "High-Performance Ontology Builder and Browser" (HOBB). HOBB not only generates an ontology but it also allows the user to "browse" attribute-value pairs that intersect in terms of common occurences in database entries, but that aren't in strict parent/child relationships to each other. In other words, their parent/child relationships need not occur at 100%.

Figure 5:
FIG. 5 is an example of a Table-Display of the present invention.

FIG. 5 is an example of the Table Display of HOBB. The values displayed are part of an analysis of a film database from the Human-Computer Intereaction Group at UMD. The database provided about 1750 entries, or records, of 9 attribute-value (a-v) pairs each. Each database entry includes an a-v pair of a film title, subject, length, actor, actress, director, popularity, awards, and year of make. In FIG. 5, HOBB is analyzing film data and is presenting the results of calculating parent/child relationships to the user.

Center column 304 includes, at the top, the a-v pair of interest at 306. This is listed as "Actor, Martin Steve." To the right of the a-v pair of interest, at 308, is the number of times that the pair occurred in the database, which in this case is nine. Left column 302 lists parents of "Actor,Martin Steve". As expected, "Subject,Comedy" and "Awards,No" have been detected as parents. Even though the matrix of data is fairly populated in this example, the same sort of capability would have been detected in even a sparse matrix of data. Right column 310 lists children of "Actor,Martin Steve". In other words, every time "Director,Reiner Carl" appeared in the database, "Actor,Martin Steve" also was there.

The entries in center column 304 below "Actor,Martin Steve", the a-v pair of interest, are a-v pairs that co-occurred in the database with "Actor,Martin Steve", ranked in order of highest frequency. The frequency of occurrence as a percentage is listed to the left of each pair. For example, one item in center column 304 is "Year,1987". This indicates that the year 1987 appeared with 22.2% (i.e. 2 of the 9) of the films in the database where "Actor,Martin Steve" appeared. We also see that "Length,60" co-occurred with "Actor, Martin Steve" 22.2% of the time. These related pairs are neither parents nor children of the a-v pair of interest, but may provide insight into the data because of their rather large "overlap" of occurrence with the a-v pair of interest. In this case, the two movies of curious titles "Steve Martin The Funnier Side of Eastern Canada" and "Steve Martin Live" were both exactly 60 minutes, and thus were probably TV specials. By displaying this portion of the probabilistic ontology the system of the present invention allows a user to quickly make inferences and form theories about relationships between the data.

Refinements to the user interface are possible. For example, the system can allow the user to specify a cut-off threshold below which related pairs will not be displayed. In FIG. 5, the cut-off to be set to "above 15%", those pairs below "Director,Reiner Carl" would not be displayed. Also, thresholds can be applied to parent and child criteria so that 100% co-occurrences are not required to place a pair into the parent or child column for a given a-v pair.

In the preferred embodiment, all of the a-v parent, child and co-occurrence relationships are pre-computed. This allows instant display of user interrogations into the a-v relationships. For example, a user can mouse-click on "Director,Reiner Carl" either in the middle or the right column to make "Director, Reiner Carl" the a-v pair of interest. "Director,Reiner Carl" will then be displayed at 306 and the display will update to show all related a-v pairs to "Director,Reiner Carl". This "browsing" feature of HOBB is very useful to the researcher in discovering relationships. The browsing feature is all the more useful because the display updating, when a new a-v pair of interest is selected, is instantaneous due to pre-computing. This allows a user to maintain concentration, be more efficient, and investigate a large number of possible relationships.

Another advantage of computing the a-v relationships is that there is no need to keep the original database with the relationships database. The relationships database may be much smaller than the original database. For example, where only a few attributes from each entry are of interest the entire entry need not be analyzed and the resulting relationships database can be smaller than the original database. Also, there may be security issues in copying the original database in its original form. Once the relationships database is created it can be analyzed separately from any hardware and software necessary to support the original database.

Yet another implementation of the invention uses existing database programs to examine the ontology. Once an ontology database of a-v pairs and their parent, child, co-occurrence relationships is created, the ontology database can simply be fed as data to an off-the-shelf database application program such as Lotus Excel or Microsoft Access. The user can operate these databases using the traditional controls provided by the third party database manufacturer, or the user can design a customized front-end to approximate the functions of the HOBB program presented herein. This allows the system of the present invention to be adaptable to small computers, such as personal computers, with a minimum of effort.

An example of applications where HOBB can assist a database researcher is where an economist has a database where each quarter is an entry, and within these entries are a-v pairs to keep track of Gross Domestic Product (GDP) growth, exports, market movements, bank lending, etc., with all applicable leads and lags in time. Using the system of the present invention (Exports, High) can be selected as the a-v pair of interest. This might show that every time (GDP Growth, High), then (Exports, High) occurs two quarters later. In other words, (GDP Growth, High) is a parent to (Exports, High). Also, the same screen might showthat every time (Exports, High), then (Consumer Confidence, Low), meaning that (Exports, High) is a parent to (Consumer Confidence, Low). By browsing around, relationships between economic occurrences will begin to form and the ones that seem prominent can be researched theoretically and otherwise, resulting in a much better understanding of the economy from a simple database.

Some additional examples of HOBB's utility could be seen in the following professions of Table II:

1. Economist—After a bit of work, you were able to gather time series dating back to 1950 on a quarterly basis covering France's and Italy's market and economic movements. Given this spreadsheet of 188 rows and numerous columns, what sort of information would be most valuable? You would be interested in questions like: When the French GDP is shrinking, what tends to happen in the Italian series? Do Italian interest rates seem affected? What about exports? All these questions are co-occurrence questions which HOBB, through its browsing feature, makes clear and explorable.

2. Medical Researcher—Over the period of a year, your hospital has been keeping track of infections, how they were treated, and how successful the treatment was. The result is a large file of patient names along with bacteria names; antibiotic names, dosages, and days of use; and perceived side effects. Do certain side effects coincide with certain antibiotic dosages? If Vancomycin is ineffective, what other antibiotics tend to be ineffective? Are there certain antibiotics that do not work well with Genus Pseudomonas? All these questions are co-occurrence questions which HOBB, through its browsing feature, makes clear and explorable.

3. Retail Marketer—After much trouble and expense, your grocery chain has set up a tracking system that records each grocery purchase and stores the information in an Oracle database. You are now setting up a new store in a busy area of town and you want to convert your newfound data on grocery purchases into a layout that maximizes convenience for your customers. When customers purchase mayonnaise, how often is this accompanied by pickles? If they get peanut butter, do they also always buy bread? HOBB is a way to browse the data and get a solid understanding of grocery purchases before you take pen in hand and lay out the shelves.

4. Direct Marketer—Using a combination of databases, you gather demographic data on 50,000 customers you feel are good candidates for your mailings. After sending a test mailing, you would like to see if there is some consistent elements or combination of elements between the demographic data and whether or not the customers responded. Once again we need to see the database through the lens of co-occurrence, which can be done utilizing HOBB.

TABLE II

The system of the present invention can be adapted for use in more generalized databases that are not already represented as a-v pairs. In these cases, the database is first pre-processed to generate the a-v pairs. For example, in a text database, such as documents from the Internet, each document is treated as a record or entry. The occurrence of a given word in a sentence, as well as co-occurrences of other words with the given word in each sentence, is used to build the a-v pairs which are analyzed by the system.

A feature of the present invention is the ability it provides to "visualize" data. Although the table display of FIG. 5 provides an adequate interface for looking at precise relationships between data, it requires some work and scrutiny do determine more "global" relationships involving larger number of a-v pairs. For example, where a first a-v pair co-occurs at 80% with another a-v pair it would seem to imply that there is a strong relationship with the two pairs. However, If the first a-v pair also occurs in 98% of the entries in the database then the fact that it intersects at 80% with the other a-v pair is not as significant. In fact, it becomes significant that it intersects with the other a-v pair only 80% of the time! In order to determine this from the table display of FIG. 5, a user must not just detect the, seemingly, high co-occurrence of the pairs in the middle column, but must compare the occurences of each a-v pair to the database as a whole.

To provide better global analysis of relationships the invention uses Venn diagrams in a "Venn Display" to show co-occurences of a-v pairs as overlaps in the diagrams. By presenting co-occurrences visually it is easier to detect strong relationships between data.

Figure 6:
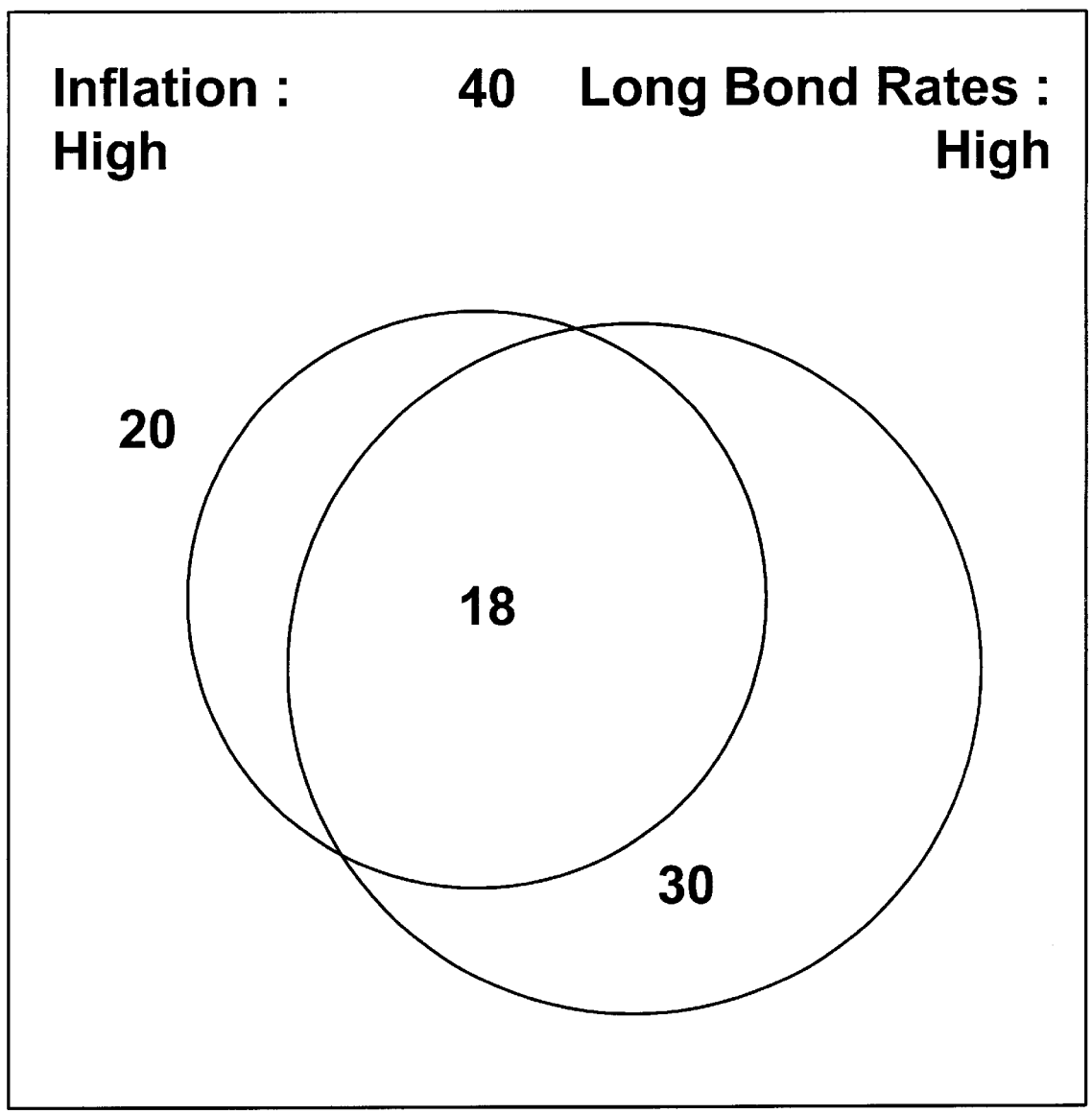
FIG. 6 is a first Venn Display.
Figure 7:
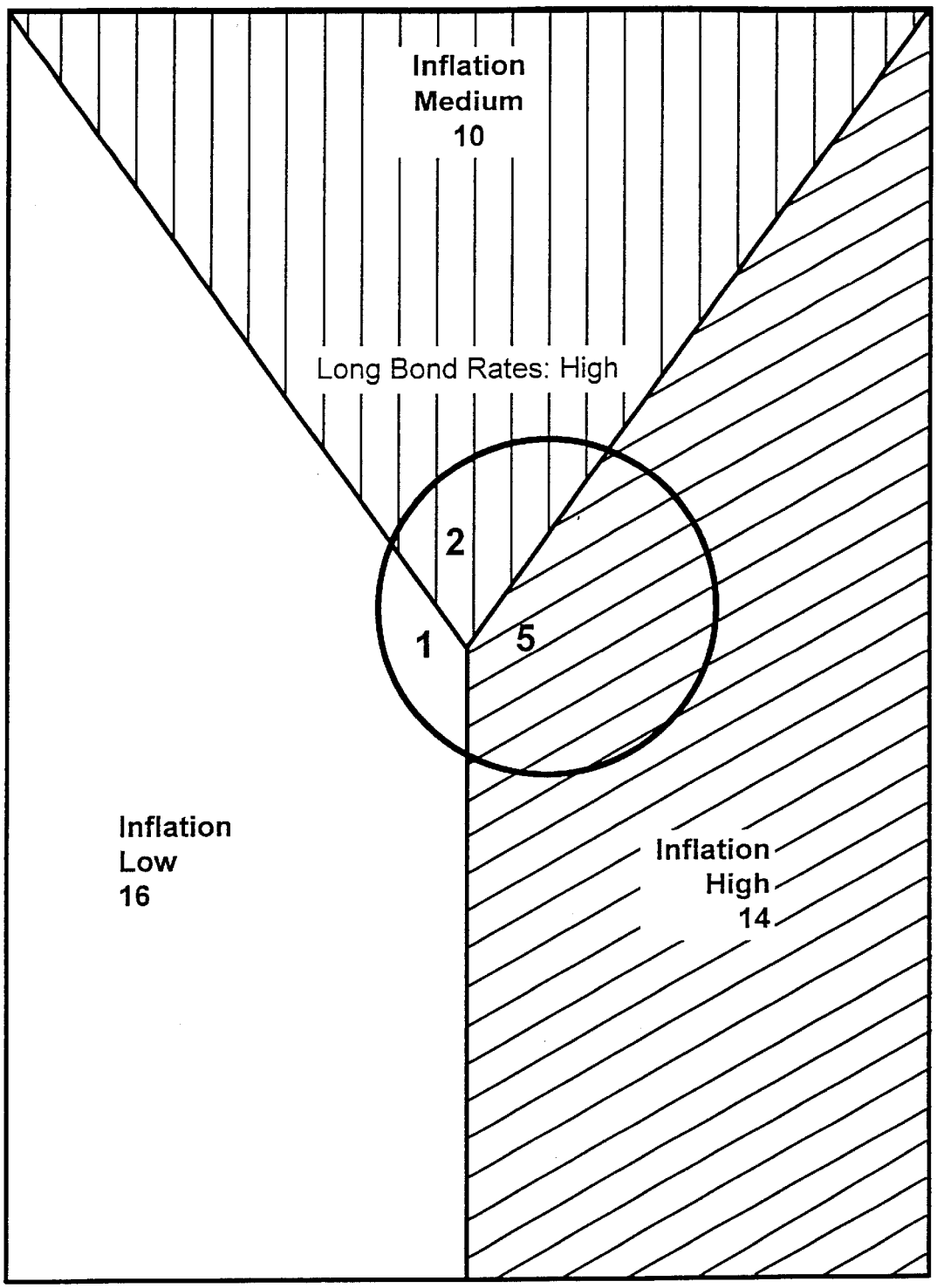
FIG. 7 is a second Venn Display.

FIGS. 6 and 7 show two examples of Venn Displays. These diagrams are displayed in color in the actual system. FIG. 6 shows (Inflation, High) as the attribute value pair in yellow, and represented by yellow circle 350. This is the a-v pair selected, or designated as "of interest," such as the pair displayed at the top of the center column in FIG. 5, as discussed above. The pair (Long Bond Rates, High) is a second pair designated by the user for comparison with the pair of interest. In the preferred embodiment, the user can mouse-click on any a-v pair on the table display of FIG. 5 to designate the clicked pair for comparison. The user can use the scroll bars to the right of each column to bring additional pairs into view.

FIG. 6 shows (LBR, H) as blue circle 352. The relative sizes of each circle, along with their area of overlap 354, are proportional with respect to the number of occurences. That is, (I, H) occurs 20 times in the database and has a yellow circle 350 that is about ⅔ of the area of the blue circle 352 representing (LBR, H) which occurs 30 times in the database. The area of overlap of the two circles is 18, which is the number of times that the two a-v pairs co-occur in the database entries. Using the Venn Display of FIG. 6, the user can quickly see co-occurrence relationships and is prevented from making errors of the type discussed above where a true interpretation of data relationships hinges on an idea of the percentage of occurence of each a-v pair to the entire database.

FIG. 7 shows a second form of Venn Display, the "Full Information Display." Using the prior example of an economic model, assume that the attribute "Inflation" can have one of three values, either "Low," "Medium" or "High." The interaction between (LBR, H) and Inflation for every possible inflation value is shown graphically in FIG. 7. It is easy to see that most of the occurences of (LBR, H) are when (I, H). Also, the overlap of (LBR, H) with (I, H) is a larger percentage of the overall occurences of (I, H) in the database than with the other a-v pairs. That is, (LBR, H) occurs in 5/14 occurrences of (I, H) ; (LBR, H) occurs in 2/10 occurrences of (I, M) and (LBR, H) occurs in 1/16 occurrences of (I, L). Again, while not shown in FIG. 7, color is used to designate each of the regions (I, L), (I, M) and (I, H).

Figure 8A:
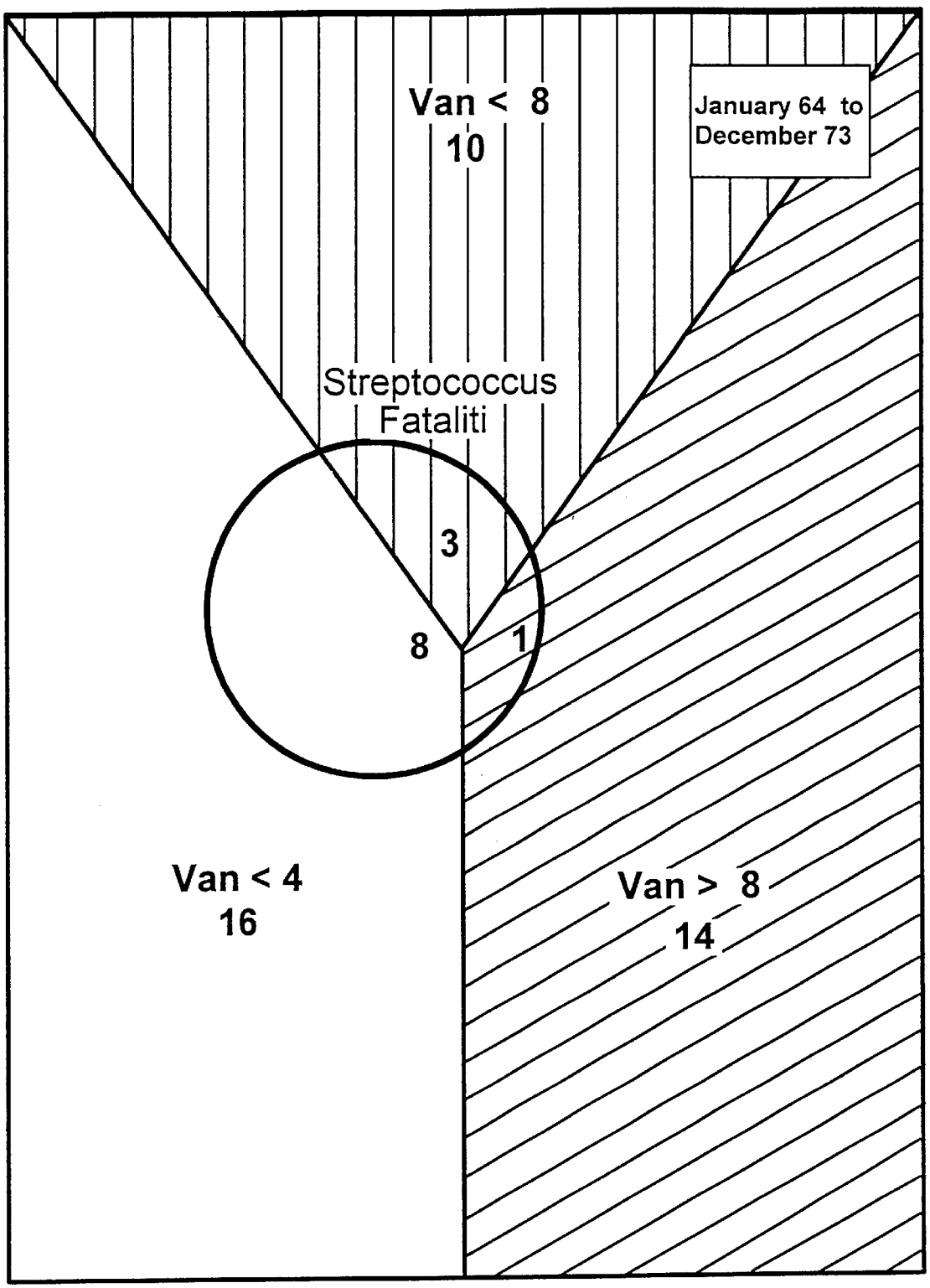
FIG. 8A is a first frame of a Venn Display animation.
Figure 8B:
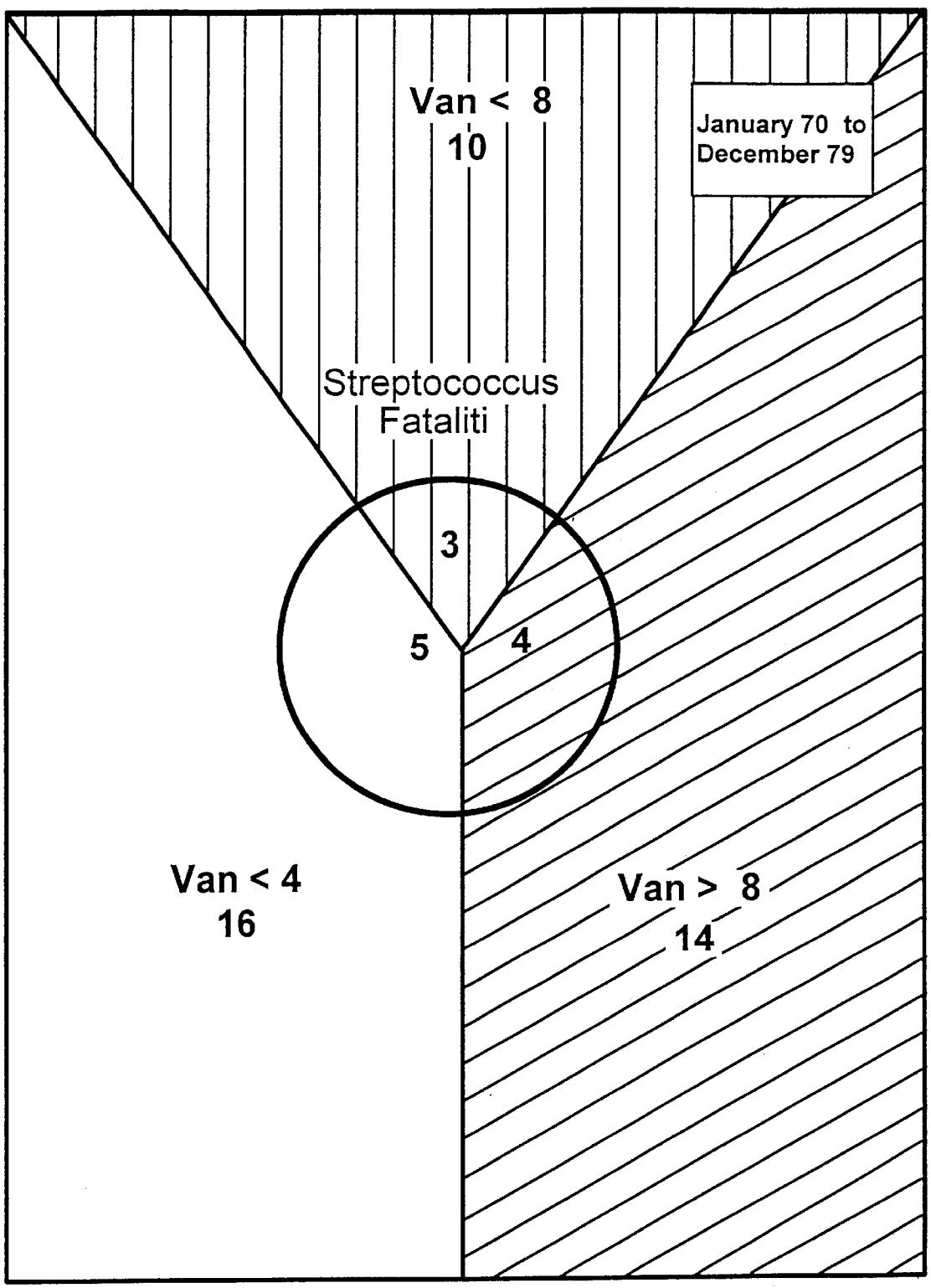
FIG. 8B is a second frame of a Venn Display animation.
Figure 8C:
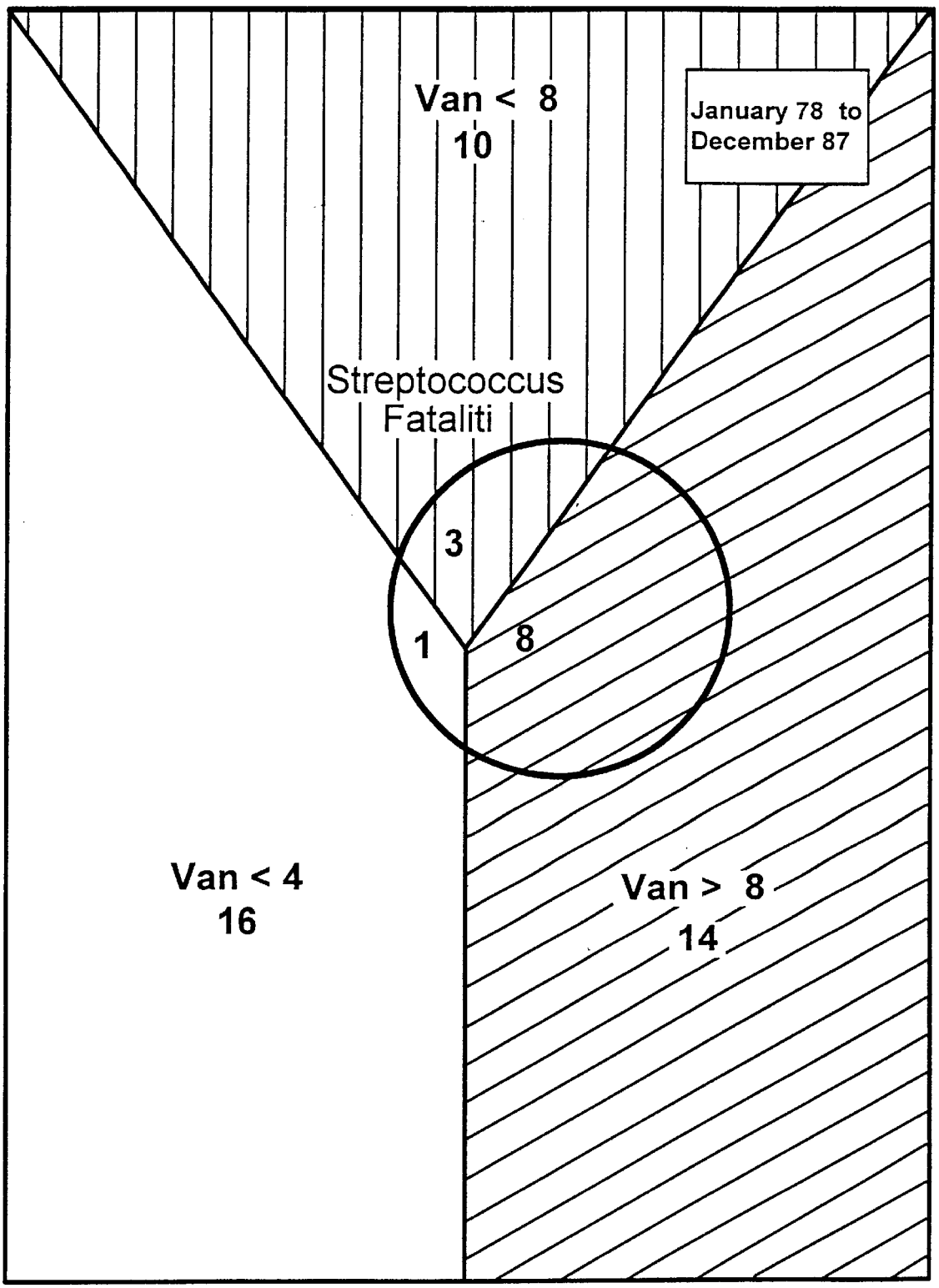
FIG. 8C is a third frame of a Venn Display animation.

FIGS. 8A–C show frames of a "movie" formed of several Venn Displays to create an animation that illustrates a change in data over time.

Suppose a researcher is interested in using the database to see if Streptococcus Fataliti is developing resistance to the antibiotic Vancomycin. A display similar to that of FIG. 7, the "Full-Information Display" is computed over different time intervals. These are shown in succession at a desired speed. From the movement of the center circle over time, it can be seen that the bacteria are gaining resistance to Vancomycin (i.e., it takes longer periods of treatment with Vancomycin to kill the bacteria).

Thus, a system for analysis and visualization of data has been presented. Although the invention has been discussed with respect to a specific embodiment, many modifications to the specific embodiment are possible without deviating from the invention, the scope of which is determined solely by the appended claims.

What is claimed is:

1. A method for displaying database relationships on a display device coupled to a processor, the method comprising storing attribute-value (a-v) pairs associated with records in a database, wherein the database is coupled to the processor, wherein an a-v pair is a child of a parent a-v pair if the parent a-v pair appears in every entry of the database in which the child a-v pair appears;

displaying an a-v pair of interest at the top-center of the display device;

displaying one or more partial child a-v pairs in a column beneath the a-v pair of interest, wherein a partial child a-v pair appears in one or more records with the a-v pair of interest;

displaying one or more parents of the a-v pair of interest in a column on the display device; and displaying one or more children of the a-v pair of interest in a column on the display device.

2. A computer-readable medium including instructions for displaying database relationships on a display device coupled to a processor, the computer-readable medium comprising one or more instructions for storing attribute-value (a-v) pairs associated with records in a database, wherein the database is coupled to the processor, wherein an a-v pair is a child of a parent a-v pair if the parent a-v pair appears in every entry of the database in which the child a-v pair appears;

one or more instructions for displaying an a-v pair of interest at the top-center of the display device;

one or more instructions for displaying one or more partial child a-v pairs in a column beneath the a-v pair of interest, wherein a partial child a-v pair appears in one or more records with the a-v pair of interest;

one or more instructions for displaying one or parents of the a-v pair of interest in a column on the display device; and one or more instructions for displaying one or more children of the a-v pair of interest in a column on the display device.

3. A computer data signal embodied in a carrier wave including instructions for displaying database relationships on a display device coupled to a processor, the computer data signal comprising one or more instructions for storing attribute-value (a-v) pairs associated with records in a database, wherein the database is coupled to the processor, wherein an a-v pair is a child of a parent a-v pair if the parent a-v pair appears in every entry of the database in which the child a-v pair appears;

one or more instructions for displaying an a-v pair of interest at the top-center of the display device;

one or more instructions for displaying one or more partial child a-v pairs in a column beneath the a-v pair of interest, wherein a partial child a-v pair appears in one or more records with the a-v pair of interest;

one or more instructions for displaying one or more parents of the a-v pair of interest in a column on the display device; and one or more instructions for displaying one or more children of the a-v pair of interest in a column on the display device.

* * * * *